US008455284B2

(12) United States Patent
Seong et al.

(10) Patent No.: US 8,455,284 B2
(45) Date of Patent: Jun. 4, 2013

(54) GROUP III NITRIDE NANOROD LIGHT EMITTING DEVICE AND METHOD OF MANUFACTURING THEREOF

(75) Inventors: Han Kyu Seong, Seoul (KR); Hun Jae Chung, Gyunggi-do (KR); Jung Ja Yang, Gyunggi-do (KR); Cheol Soo Sone, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 13/231,415

(22) Filed: Sep. 13, 2011

(65) Prior Publication Data

US 2012/0068153 A1 Mar. 22, 2012

(30) Foreign Application Priority Data

Sep. 14, 2010 (KR) .................. 10-2010-0090115

(51) Int. Cl.
*H01L 21/00* (2006.01)
(52) U.S. Cl.
USPC .................. 438/47; 257/13; 257/E33.008
(58) Field of Classification Search
USPC .......... 438/22, 47; 257/13, E33.008, E33.023
See application file for complete search history.

(56) References Cited

U.S. PATENT DOCUMENTS

| 7,521,274 | B2 | 4/2009 | Hersee et al. |
| 2009/0169828 | A1* | 7/2009 | Hersee et al. .................. 428/172 |
| 2010/0059779 | A1* | 3/2010 | Chen et al. ...................... 257/98 |

FOREIGN PATENT DOCUMENTS

KR 10-0661960 B1 12/2006

* cited by examiner

*Primary Examiner* — Tony Tran
(74) *Attorney, Agent, or Firm* — McDermott Will & Emery LLP

(57) ABSTRACT

A group III nitride nanorod light emitting device and a method of manufacturing thereof. The method includes preparing a substrate, forming an insulating film including one or more openings exposing parts of the substrate on the substrate, growing first conductive group III nitride nanorod seed layers on the substrate exposed through the openings by supplying a group III source gas and a nitrogen (N) source gas thereto, growing first conductive group III nitride nanorods on the first conductive group III nitride nanorod seed layers by supplying the group III source gas and an impurity source gas in a pulse mode and continuously supplying the N source gas, forming an active layer on a surface of each of the first conductive group III nitride nanorods, and forming a second conductive nitride semiconductor layer on the active layer.

11 Claims, 12 Drawing Sheets

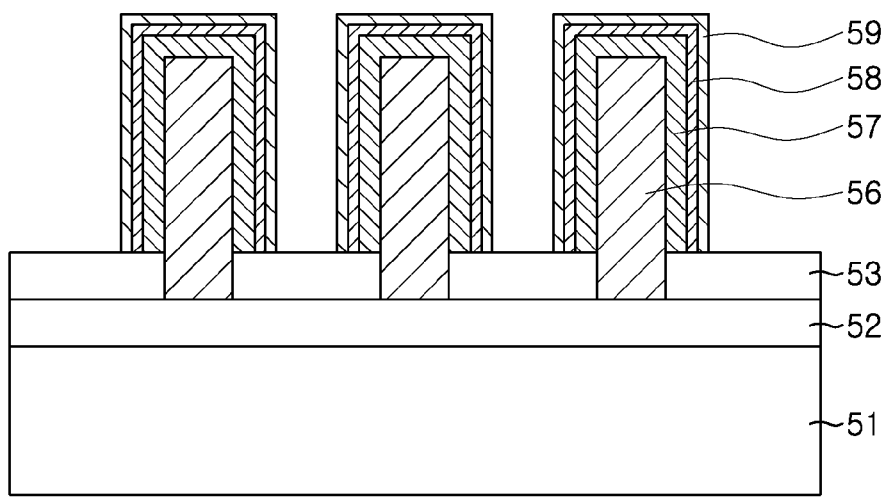
FIG. 5C
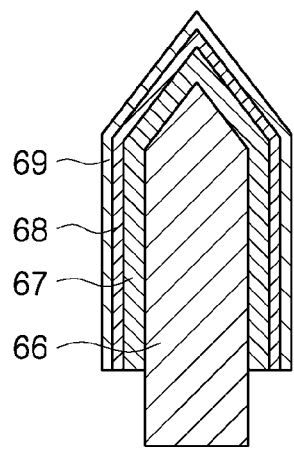 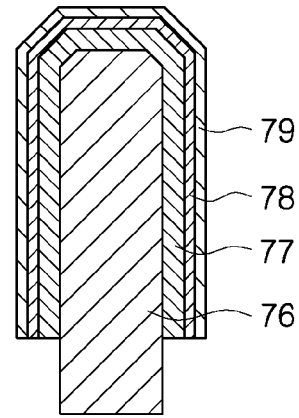
FIG. 6A   FIG. 6B

GROUP III NITRIDE NANOROD LIGHT EMITTING DEVICE AND METHOD OF MANUFACTURING THEREOF

CROSS-REFERENCE TO RELATED APPLICATIONS

This application claims the priority of Korean Patent Application No. 10-2010-0090115 filed on Sep. 14, 2010, in the Korean Intellectual Property Office, the disclosure of which is incorporated herein by reference.

BACKGROUND OF THE INVENTION

1. Field of the Invention

The present invention relates to a group III nitride nanorod, and more particularly, to a light emitting device using the group III nitride nanorod and a method of manufacturing thereof.

2. Description of the Related Art

In general, in a case in which a group III nitride nanorod is grown above a substrate, properly controlling the diameter, length, growth position, and crystal growth direction of the nanorod may be difficult, thereby causing difficulties in forming a nanorod having a desired shape and generating defects, whereby the driving voltage of a device is increased and the operating characteristics of the device are degraded.

In particular, in the case of optoelectronic devices, such limitations may deteriorate the luminous efficiency and shorten the lifespan thereof, while operating based on the recombination of carriers.

SUMMARY OF THE INVENTION

An aspect of the present invention provides a group III nitride nanorod light emitting device in which crystal defects generated during the growing of a single crystal nanorod are minimized and the luminous efficiency of a light emitting device having a three-dimensional structure is improved, and a method of manufacturing thereof.

According to an aspect of the present invention, there is provided a method of manufacturing a group III nitride nanorod light emitting device, the method including: preparing a substrate; forming an insulating film including one or more openings exposing parts of the substrate on the substrate; growing first conductive group III nitride nanorod seed layers on parts of the substrate exposed through the openings, by supplying of a group III source gas and a nitrogen (N) source gas; growing first conductive group III nitride nanorods on the first conductive group III nitride nanorod seed layers by supplying the group III source gas and an impurity source gas in a pulse mode and continuously supplying the N source gas; forming an active layer on a surface of each of the first conductive group III nitride nanorods; and forming a second conductive nitride semiconductor layer on the active layer.

In the growing of the first conductive group III nitride nanorod seed layers, the first conductive group III nitride nanorod seed layers may have growth rates in the range of 70 nm/min to 120 nm/min.

In the growing of the first conductive group III nitride nanorod seed layers, the first conductive group III nitride nanorod seed layers may be grown to a height of the insulating film.

The growing of the first conductive group III nitride nanorods may include a first growth process forming middle portions of the first conductive group III nitride nanorods on the first conductive group III nitride nanorod seed layers and a second growth process forming end portions of the first conductive group III nitride nanorods.

In the second growth process, at least one of a temperature in the second growth process, a flow rate of the group III source gas, a flow rate of the N source gas, and a pulse width of the group III source gas may be controlled to thereby control shapes of the end portions of the first conductive group III nitride nanorods.

In the growing of the first conductive group III nitride nanorods, the first conductive group III nitride nanorods may have growth rates in the range of 30 nm/min to 70 nm/min.

The group III source gas and the impurity source gas may be scattered in a pulse mode having a predetermined period and a predetermined pulse width.

The substrate may include at least one selected from a group consisting of sapphire, silicon (Si), zinc oxide (ZnO), gallium arsenide (GaAs), silicon carbide (SiC), $MgAl_2O_4$, a magnesium oxide (MgO), lithium aluminate ($LiAlO_2$), $LiGaO_2$, and gallium nitride (GaN).

The insulating film may include at least one selected from a group consisting of silicon dioxide ($SiO_2$), titanium dioxide ($TiO_2$), aluminum oxide ($Al_2O_3$), titanium nitride (TiN), aluminum nitride (AlN), zirconium dioxide ($ZrO_2$), titanium aluminium nitride (TiAlN), titanium silicon nitride (TiSiN), and silicon nitride ($Si_3N_4$).

The impurity source gas may be silane ($SiH_4$). The group III source gas may be trimethyl gallium (TMGa). The N source gas may be ammonia ($NH_3$).

The active layer may include at least a pair of a quantum barrier layer and a quantum well layer.

The quantum barrier layer may be formed of $Al_yGa_{1-y}N$ ($0 \leq y \leq 1$), and the quantum well layer may be formed of $In_xGa_{1-x}N$ ($0 \leq x \leq 1$).

The method may further comprise an electron blocking layer between the active layer and the second conductive nitride semiconductor layer.

According to another aspect of the present invention, there is provided a group III nitride nanorod light emitting device manufactured by the method.

BRIEF DESCRIPTION OF THE DRAWINGS

The above and other aspects, features and other advantages of the present invention will be more clearly understood from the following detailed description taken in conjunction with the accompanying drawings, in which:

FIGS. 5A through 5C are diagrams showing a process of forming light emitting structures on first conductive group III nitride nanorods selectively grown above a substrate;

FIGS. 6A and 6B are diagrams showing that light emitting structures are stacked on first conductive group III nitride nanorods having various end portion shapes;

DETAILED DESCRIPTION OF THE PREFERRED EMBODIMENT

Figure 1A:
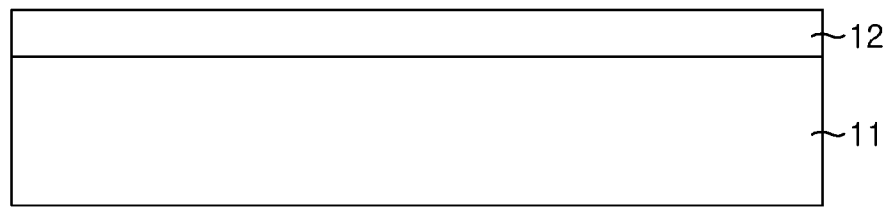
FIGS. 1A through 1D are diagrams showing a process of forming first conductive group III nitride nanorods above a substrate according to an exemplary embodiment of the present invention.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. While those skilled in the art could readily devise many other varied embodiments that incorporate the teachings of the present invention through the addition, modification or deletion of elements, such embodiments may fall within the scope of the present invention.

The same or equivalent elements are referred to by the same reference numerals throughout the specification.

FIGS. 1A through 1D are diagrams showing a process of forming first conductive group III nitride nanorods above a substrate according to an exemplary embodiment of the present invention.

Referring to FIG. 1A, a buffer layer 12 may be formed on a substrate 11.

The substrate 11 is a growth substrate for growing a semiconductor single crystal, in particular, a nitride single crystal. The substrate 11 may be, for example, made of a material such as a sapphire, silicon (Si), a zinc oxide (ZnO), gallium arsenide (GaAs), silicon carbide (SiC), $MgAl_2O_4$, a magnesium oxide (MgO), lithium aluminate ($LiAlO_2$), $LiGaO_2$, gallium nitride (GaN), or the like. The sapphire is a crystal having Hexa-Rhombo R3c symmetry, and has a C(0001)-plane, an A(1120)-plane, an R(1102)-plane, or the like. In this case, since the C-plane may be relatively facilitated for the growth of a nitride thin film, and stable at a high temperature, the C-plane may be mainly used as a substrate for growing a nitride semiconductor.

The buffer layer 12 employed in this exemplary embodiment of the present invention may be made of a semiconductor material formed of $Al_xIn_yGa_{(1-x-y)}N$ ($0 \leq x \leq 1$, $0 \leq y \leq 1$, $0 \leq x+y \leq 1$) doped with impurities. Silicon (Si), germanium (Ge), selenium (Se), tellurium (Te) or the like may be used as n-type impurities, and magnesium (Mg), zinc (Zn), beryllium (Be) or the like may be used as p-type impurities. For example, gallium nitride (GaN), aluminum gallium nitride (AlGaN), indium gallium nitride (InGaN), or the like may be used as the buffer layer 12. The buffer layer 12 may be an n-type nitride semiconductor or a p-type nitride semiconductor such as first conductive group III nitride nanorods, to be explained later. The buffer layer 12 may be grown by a process, such as metal organic chemical vapor deposition (MOCVD), molecular beam epitaxy (MBE), hydride vapor phase Epitaxy (HVPE) or the like. By way of example, a C(0001)-plane sapphire substrate 11 is prepared in a reactor chamber within a MOCVD apparatus to apply heat thereto, thereby allowing for the deposition of the buffer layer 12, a n-GaN semiconductor layer, on the substrate at a temperature of about 1080° C.

Figure 1B:
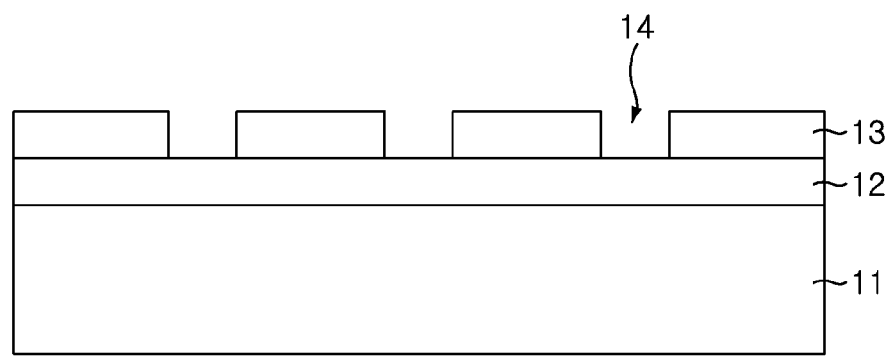

Referring to FIG. 1B, an insulating film 13 including a plurality of patterned openings 14 exposing plural parts of the buffer layer 12 may be formed on the buffer layer 12. By way of example, the insulating film 13 may be deposited on the buffer layer 12 and etched by a lithography process to thereby form the patterned openings 14 in the insulating film 13. The openings 14 may be formed to have a certain diameter and a certain distance therebetween in order to designate a diameter, a length, and a position of the first conductive group III nitride nanorods to be grown, or the openings 14 may be formed in the insulating film 13 in such a manner as to have different diameters and distances therebetween. The openings 14 may have various shapes, such as a circular, a quadrangle, a hexagon or the like.

The insulating film 13 employed in this exemplary embodiment of the present invention may function to prevent contact between an n-type nitride semiconductor layer and a p-type nitride semiconductor layer. In consideration of this function, the insulating film 13 may be made of a silicon oxide or a silicon nitride, for example, silicon dioxide ($SiO_2$), titanium dioxide ($TiO_2$), silicon nitride ($Si_3N_4$), aluminum oxide ($Al_2O_3$), titanium nitride (TiN), aluminum nitride (AlN), zirconium dioxide ($ZrO_2$), titanium aluminium nitride (TiAlN), titanium silicon nitride (TiSiN), or the like.

Figure 1C:
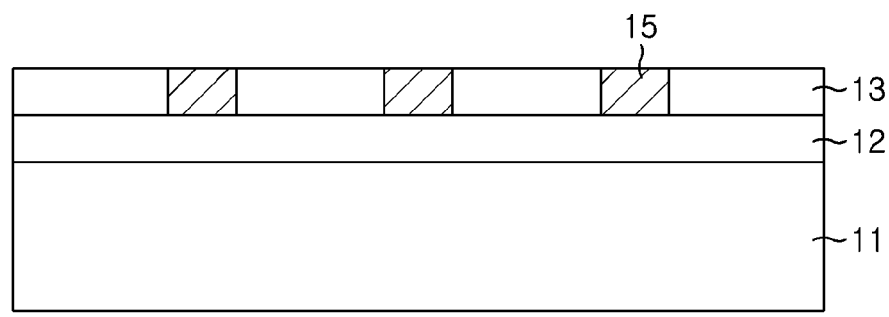
Figure 7:
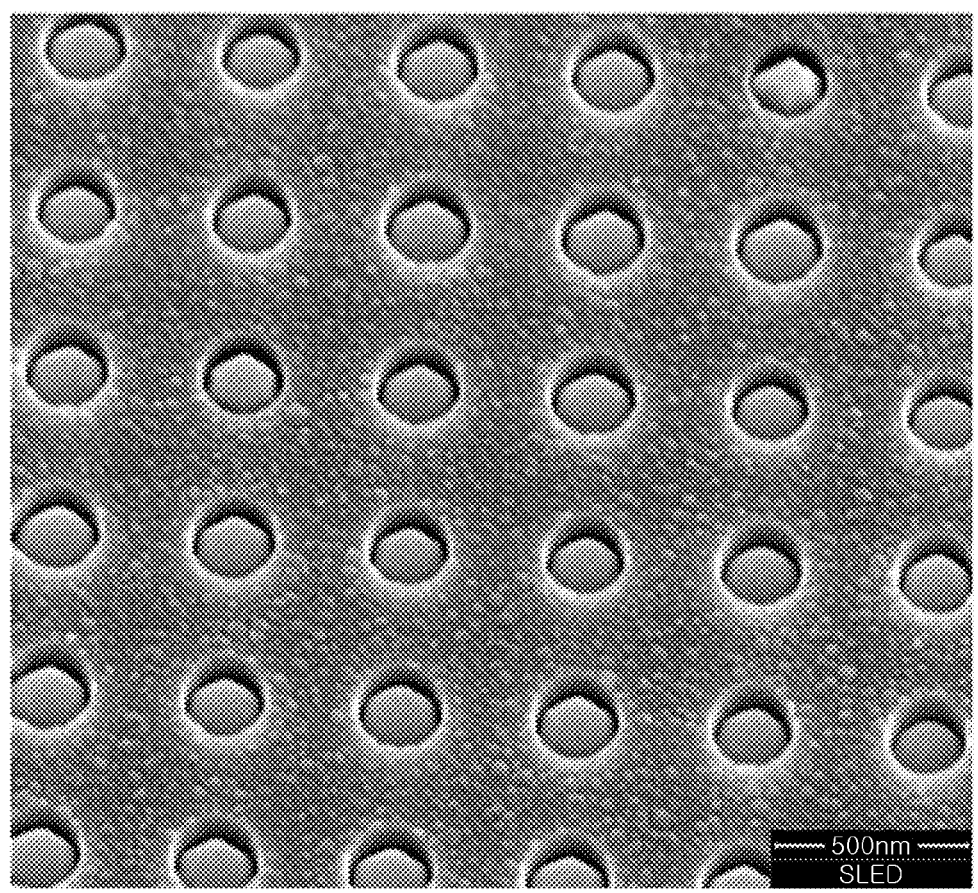
FIG. 7 is a scanning electron microscope (SEM) microphotograph showing that first conductive group III nitride nanorod seed layers are formed in a plurality of openings of an insulating film.

Referring to FIG. 1C, first conductive group III nitride nanorod seed layers 15 are grown on the buffer layer 12 exposed by one or more openings 14 in the insulating film 13. In the growth process of the first conductive group III nitride nanorod seed layers 15, by way of example, while a temperature in the reactor chamber equipped with the substrate 11 may be maintained at a temperature of approximately 900° C. to 1100° C. and a gallium source, trimethyl gallium (TMGa) of about 10 sccm to 200 sccm and an ammonia ($NH_3$) gas of 15000 sccm to 20000 sccm are supplied, the respective first conductive group III nitride nanorod seed layers 15 may be deposited to the height of the insulating film 13, that is, approximately 50 nm to 100 nm at a temperature of approximately 1000° C. to 1100° C. for about 1 min to 5 min. The growth rate in a process of growing the first conductive group III nitride nanorod seed layers 15 may be approximately 70 nm/min to 120 nm/min. FIG. 7 is a scanning electron microscope (SEM) microphotograph showing that the first conductive group III nitride nanorod seed layers are formed in the openings of the insulating film.

The growth rate of the first conductive group III nitride nanorod seed layers 15 may be controlled by performing a mass transfer of an organic compound, preferably, TMGa and n-type impurities (preferably Si based-) to an interface of the buffer layer 12.

Figure 1D:
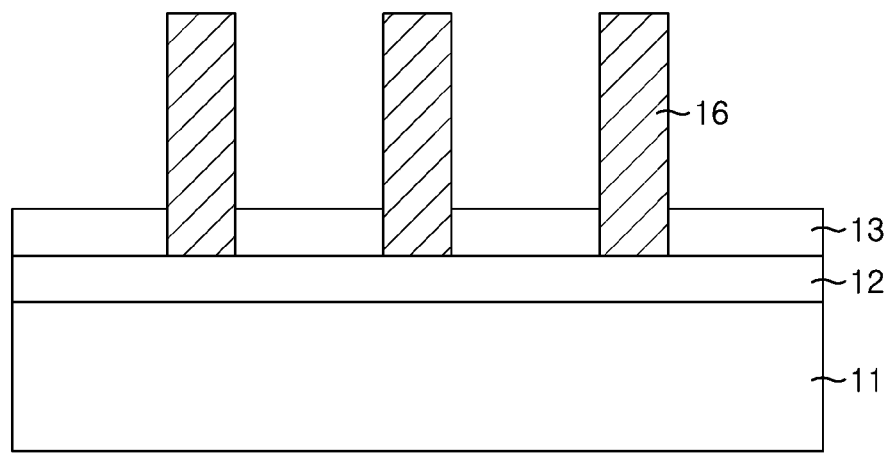

Referring to FIG. 1D, first conductive group III nitride nanorods 16 may be grown on the basis of the first conductive group III nitride nanorod seed layers 15. This process is referred to as a first growth process.

Figure 2:
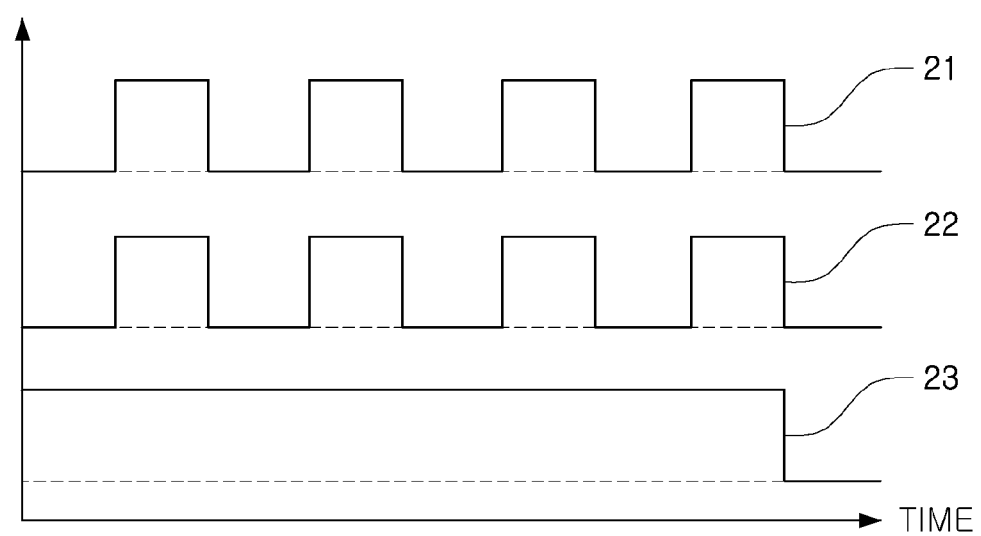
FIG. 2 shows the flow rates of a group III source gas, an N source gas and an impurity source gas supplied during a first growth process.

FIG. 2 shows the flow rates of a group III source gas, an N source gas and an impurity source gas supplied during a first growth process. Referring to FIG. 2, while the N source gas, ammonia, is continuously and regularly scattered on the substrate (23), the III source gas, TMGa is scattered on the substrate in a pulse mode at a predetermined pulse width and a predetermined period (22).

At this time, in the case of the doping of impurities, the impurity source gas is also scattered on the substrate at a predetermined pulse width and a predetermined period (21). The impurity source gas may be silane ($SiH_4$). By way of example, during the first growth process, the flow rate of the gallium source, TMGa, may be reduced to approximately 50 sccm to 150 sccm and the flow rate of ammonia (NH$_3$) gas may be reduced to approximately 500 sccm to 5000 sccm, such that the first conductive group III nitride nanorods 16 may be grown at a temperature of approximately 900° C. to 1100° C.

By again referring to FIG. 1D, the first conductive group III nitride nanorods 16 may have a growth direction in accordance with that of the buffer layer 12, the n-type semiconductor layer. Accordingly, the growth direction of the substrate and the n-type semiconductor layer may determine the growth direction of a plurality of the first conductive group III nitride nanorods 16 having individual diameters and lengths. These first conductive group III nitride nanorods 16 may be manufactured by a single batch process, and the lengths of the first conductive group III nitride nanorods 16 may be adjusted by controlling the pulse width, the flow rate, the pulse count, the pulse period, the pulse time of the group III source gas. In this case, the diameters of the first conductive group III nitride nanorods 16 may be uniformly maintained. The first conductive group III nitride nanorods 16 are conductive semiconductors, and may be formed of n-GaN or p-GaN.

According to an exemplary embodiment of the present invention, when the patterned openings 14 of the insulating film 13 have diameters in the range of approximately 100 nm to 180 nm, the first grown conductive group III nitride nanorods 16 have diameters in the range of approximately 120 nm to 200 nm. When the patterned openings 14 of the insulating film have diameters in the range of approximately 180 nm to 250 nm, the first grown conductive group III nitride nanorods 16 have diameters in the range of approximately 200 nm to 280 nm. When the patterned openings 14 of the insulating film 13 have diameters in the range of approximately 250 nm to 400 nm, the first grown conductive group III nitride nanorods 16 have diameters in the range of approximately 280 nm to 450 nm. Therefore, it can be confirmed that the diameters of the first conductive group III nitride nanorods 16 may be substantially proportional to the diameters of the patterned openings 14, and the diameters of the nanorods 16 may be formed to be larger than those of the patterned openings 14 by approximately 10% to 20%. In addition, through the scanning electron microscope, it can be seen that the lengths of the first conductive group III nitride nanorods 16 may also be changed according to the diameters of the openings 14. The lengths of the first conductive group III nitride nanorods 16 may be adjusted by controlling time spent at the batch process temperature.

Figure 3A:
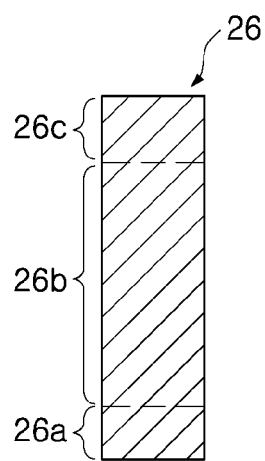
FIGS. 3A through 3C are diagrams showing first conductive group III nitride nanorods according to an exemplary embodiment of the present invention.
Figure 3B:
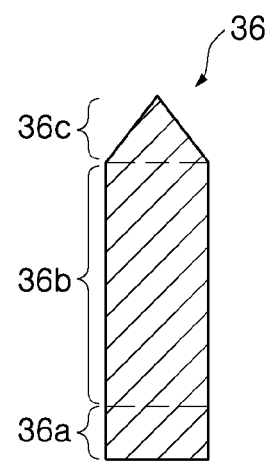
Figure 3C:
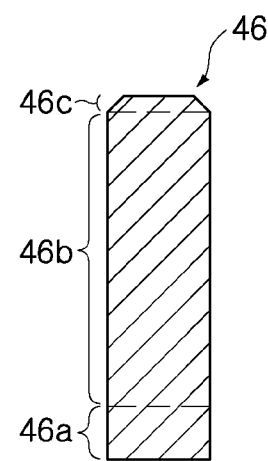

FIGS. 3A through 3C are diagrams showing first conductive group III nitride nanorods according to an exemplary embodiment of the present invention. The process of determining end portion shapes of the first conductive group III nitride nanorods which has been grown through the first growth process may be referred to as a second growth process.

Referring to FIGS. 3A through 3C, first conductive group III nitride nanorods 26, 36, and 46 may include nanorod seed layers 26A, 36A, and 46A, nanorod middle portions 26B, 36B, and 46B grown through the first growth process, and nanorod end portions 26C, 36C, and 46C grown through the second growth process.

As the conditions of the second growth process are changed, the end portions 26C, 36C, and 46C of the first conductive group III nitride nanorods may have a plane shape as shown in FIG. 3A, a triangular shape as shown in FIG. 3B, or a polygonal shape as shown in FIG. 3C. The conditions of the second growth process will be explained in detail as follows.

FIGS. 4A through 4D shows shape changes of end portions of first conductive group III nitride nanorods according to conditions of the second growth process. The variables determining the end portion shape of the first conductive group III nitride nanorod are four: temperature in the second growth process, TMGa flow rate, NH$_3$ flow rate, and TMGa pulse width.

Figure 4A:
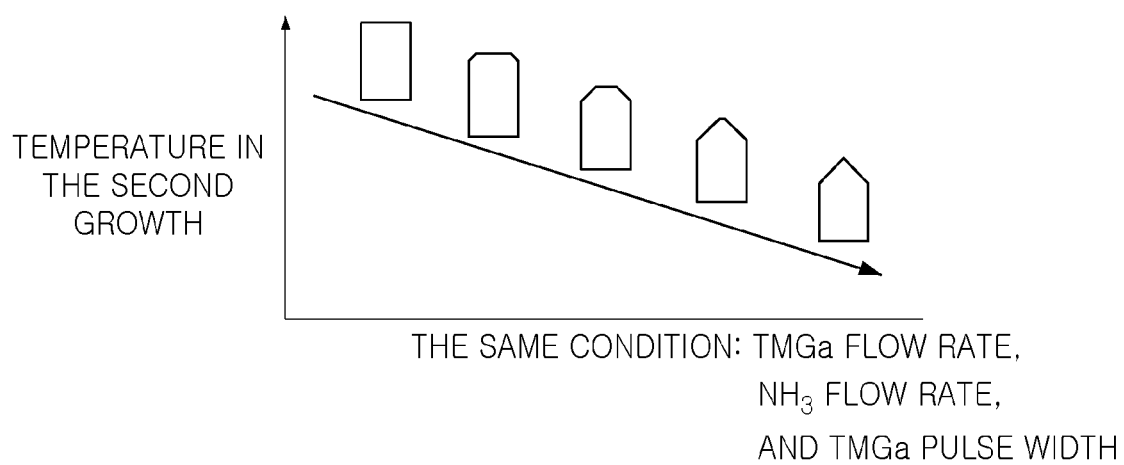
FIGS. 4A through 4D shows shape changes of end portions of first conductive group III nitride nanorods according to conditions of a second growth process.

Referring to FIG. 4A, as the temperature in the second growth process drops, the end portion shape of the first conductive group III nitride nanorod is changed from being planar to pointed, that is, having a triangular shape.

Figure 4B:
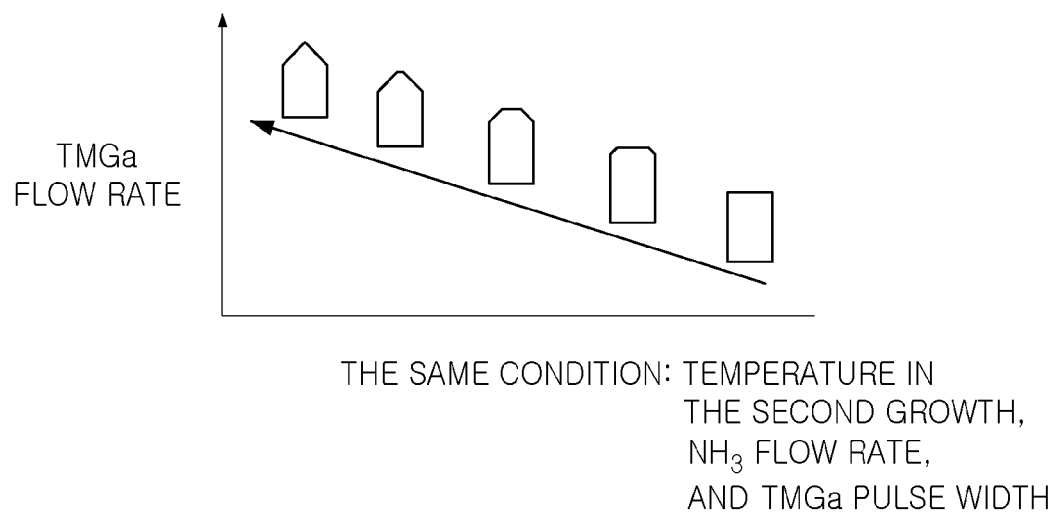

Referring to FIG. 4B, as the TMGa flow rate increases, the end portion shape of the first conductive group III nitride nanorod is changed from being planar to pointed.

Figure 4C:
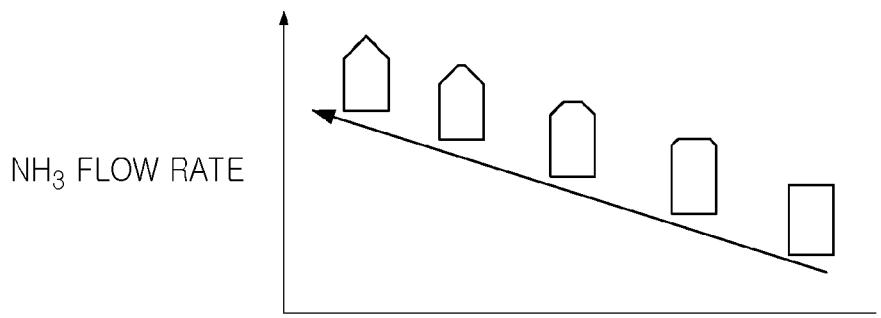

Referring to FIG. 4C, as the NH$_3$ flow rate increases, the end portion shape of the first conductive grouP III nitride nanorod is changed from being planar to pointed.

Figure 4D:
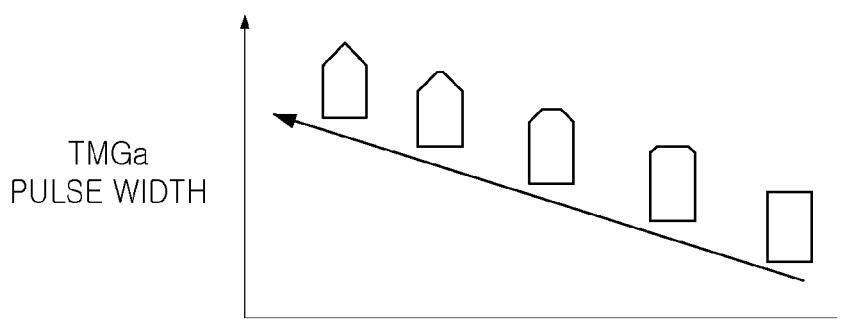

Referring to FIG. 4D, as the TMGa pulse width increases, the end portion shape of the first conductive group III nitride nanorod is changed from being planar to pointed.

Figure 8A:
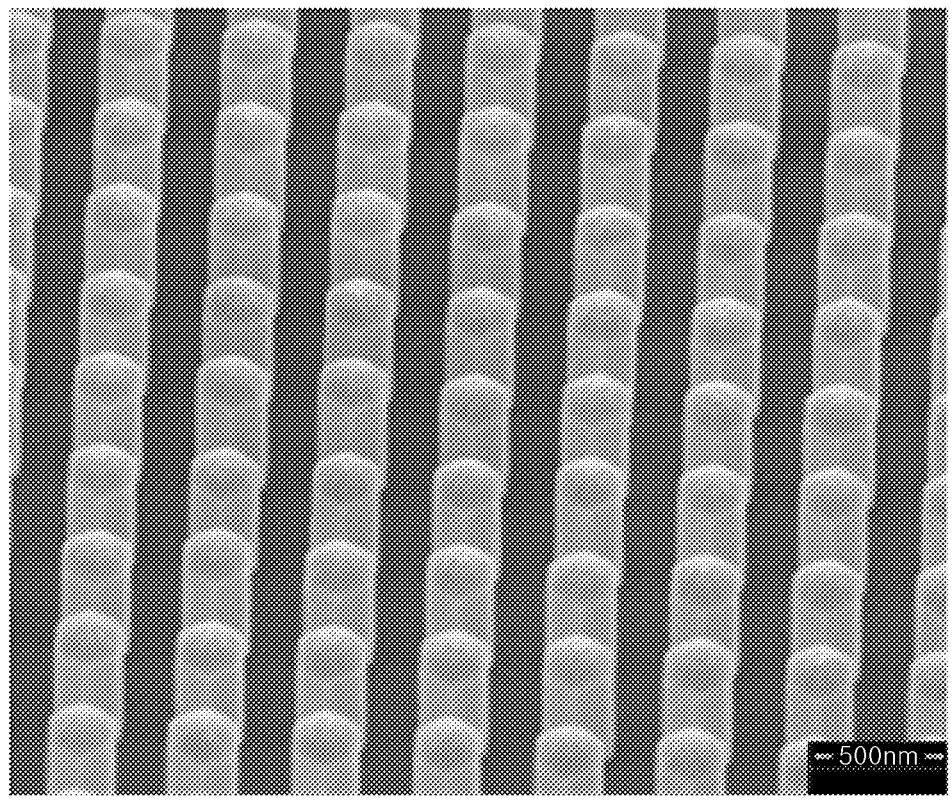
FIGS. 8A through 8C are SEM microphotographs showing that first conductive group III nitride nanorods having various end portion shapes are grown, after the second growth process.
Figure 8B:
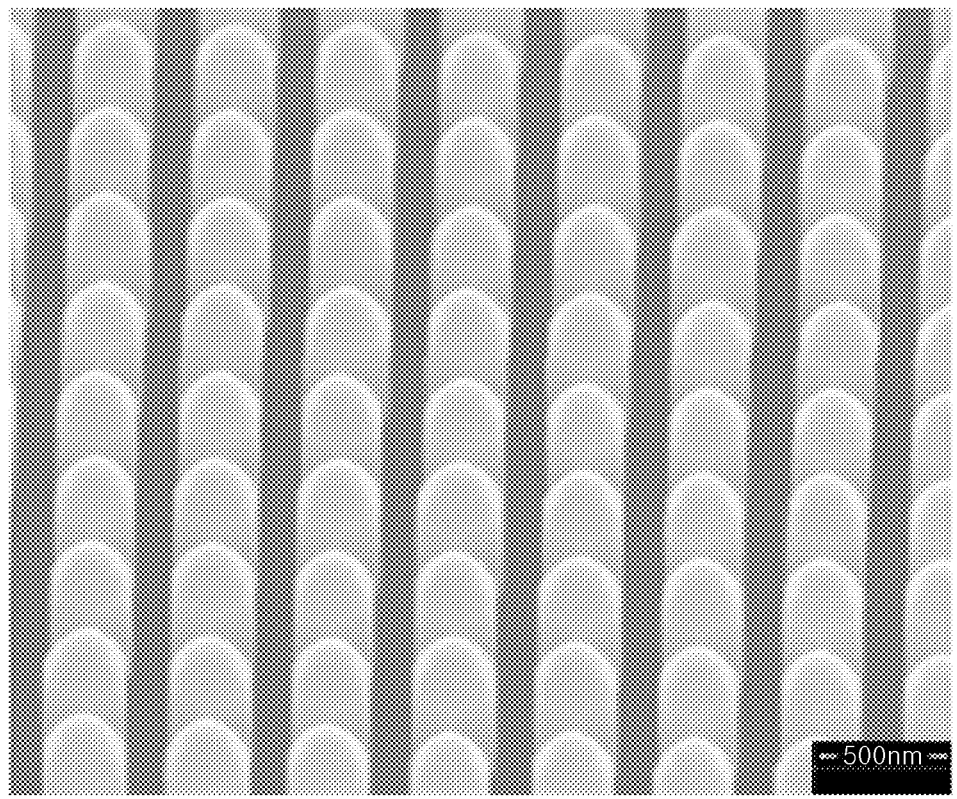
Figure 8C:
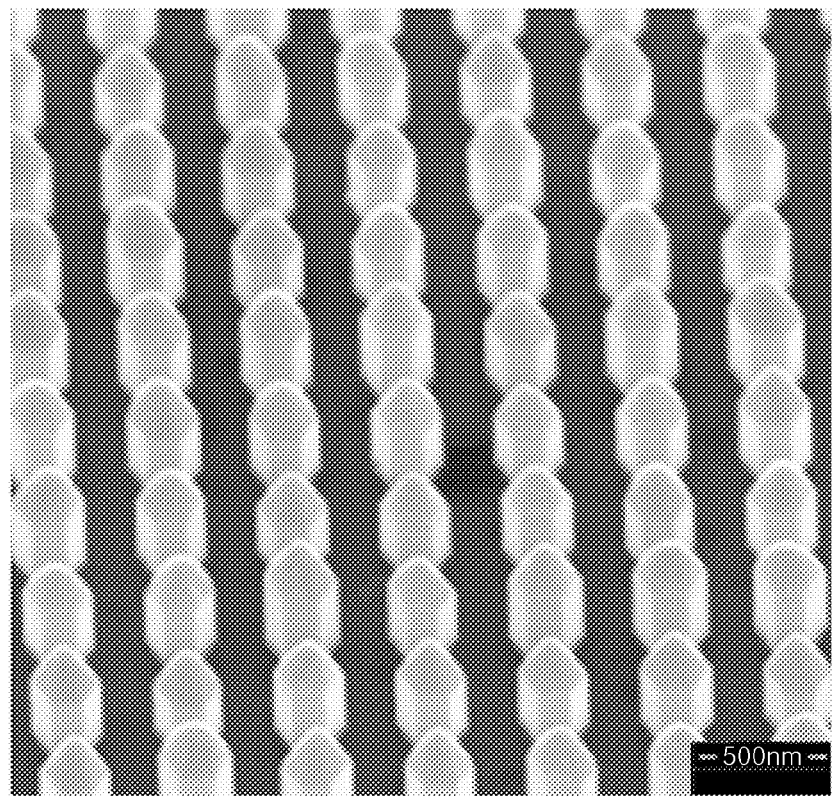

In this case, only one variable is changed while the three remaining variables are maintained without variation. FIGS. 8A through 8C are SEM microphotographs showing that first conductive group III nitride nanorods having various end portion shapes are grown, after the second growth process.

Meanwhile, the growth rates of the first conductive group III nitride nanorods are within the range of approximately 30 nm/min to 70 nm/min in the first and second growth processes. The internal pressure of the reactor chamber may be maintained to approximately 70 mbar to 200 mbar in both of the first and second growth processes.

Figure 5A:
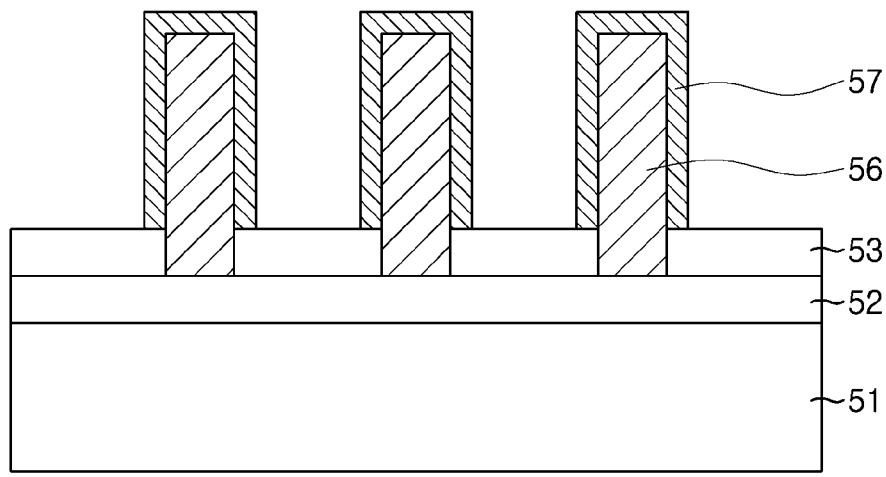
Figure 5B:
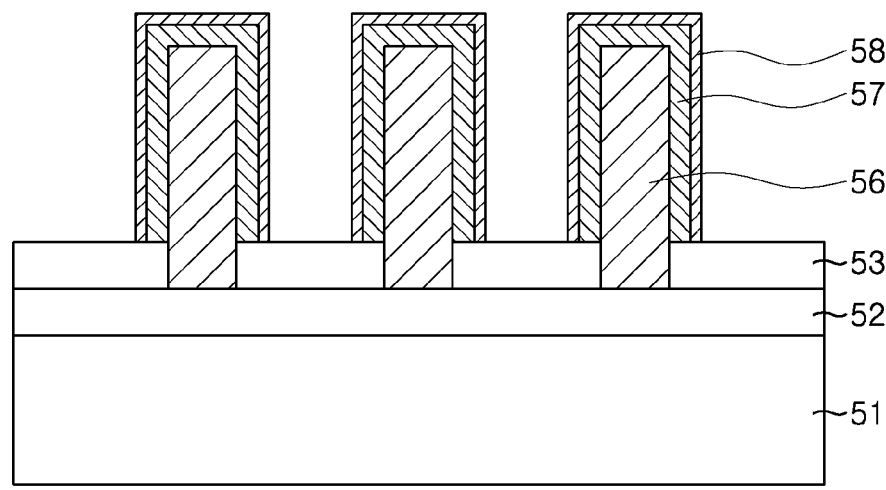

FIGS. 5A through 5C are diagrams showing a process of forming light emitting structures on first conductive group III nitride nanorods 56 selectively grown above a substrate 51. The light emitting structures may be formed on the first conductive group III nitride nanorods 56 by a batch process in the same system by which the first conductive group III nitride nanorods 56 are grown.

Referring to FIG. 5A, an active layer 57 is formed on the surface of a first conductive group III nitride nanorod 56 formed above a substrate 51 on which a buffer layer 52 and an insulating film 53 are sequentially stacked. The active layer 57 may be grown as a single crystal, in the same manner as the first conductive group III nitride nanorod 56. The active layer 57 may be grown to emit light having a predetermined energy by the light-emitting recombination of electrons and electron holes. The active layer 57 may include at least a pair of a quantum barrier layer and a quantum well layer. The active layer 57 may have a multiple quantum well structure. By way of example, the quantum barrier layer may be formed of Al$_y$Ga$_{1-y}$N($0 \leq y \leq 1$), and the quantum well layer may be formed of In$_x$Ga$_{1-x}$N($0 \leq x \leq 1$), whereby bandgap energy may be adjusted depending on the content of indium (In). In an exemplary embodiment, the formation of the active layer 57 may be performed at a temperature lower than the formation temperature of the first conductive group III nitride nanorod 56 by approximately 100° C. to 300° C.

FIG. 5B shows a process of forming an electron blocking layer (EBL) 58 on the active layer 57. In order to improve the internal quantum efficiency of a light emitting device, the electron blocking layer 58 having a large energy bandgap may be provided between the active layer 57 and a p-type semiconductor layer. The electron blocking layer 58 may prevent the electron introduced into the active layer 57 from the n-type semiconductor layer from being transferred to the p-type semiconductor layer to thereby confine the electrons within the active layer 57, whereby the recombination rate of electrons and electron-holes within the active layer 57 may be ultimately increased. This process may be excluded when necessary.

Referring to FIG. 5C, a second conductive semiconductor layer 59 is formed on the electron blocking layer 58 so as to cover the entire surface of the electron blocking layer 58. The thickness of the second conductive semiconductor layer 59 may be approximately 20 nm or more. When the first conductive group III nitride nanorod 56 is an n-type semiconductor, the second conductive semiconductor layer 59 may be a p-type semiconductor layer. While, when the first conductive group III nitride nanorod 56 is a p-type semiconductor, the second conductive semiconductor layer 59 may be an n-type semiconductor layer.

FIGS. 6A and 6B are diagrams showing that light emitting structures are stacked on first conductive group III nitride nanorods 66 and 76 having various end portion shapes. Referring to FIG. 6A, an active layer 67, an electron blocking layer 68, and a second conductive semiconductor layer 69 are formed on a first conductive group III nitride nanorod 66 having a triangular shaped end portion. Referring to FIG. 6B, an active layer 77, an electron blocking layer 78, and a second conductive semiconductor layer 79 are formed on a first conductive group III nitride nanorod 76 having a polygon-shaped end portion. The structure stacked on each of the first conductive group III nitride nanorods 66 and 76 may have a shape same as that of each of the first conductive group III nitride nanorods 66 and 76.

Figure 9:
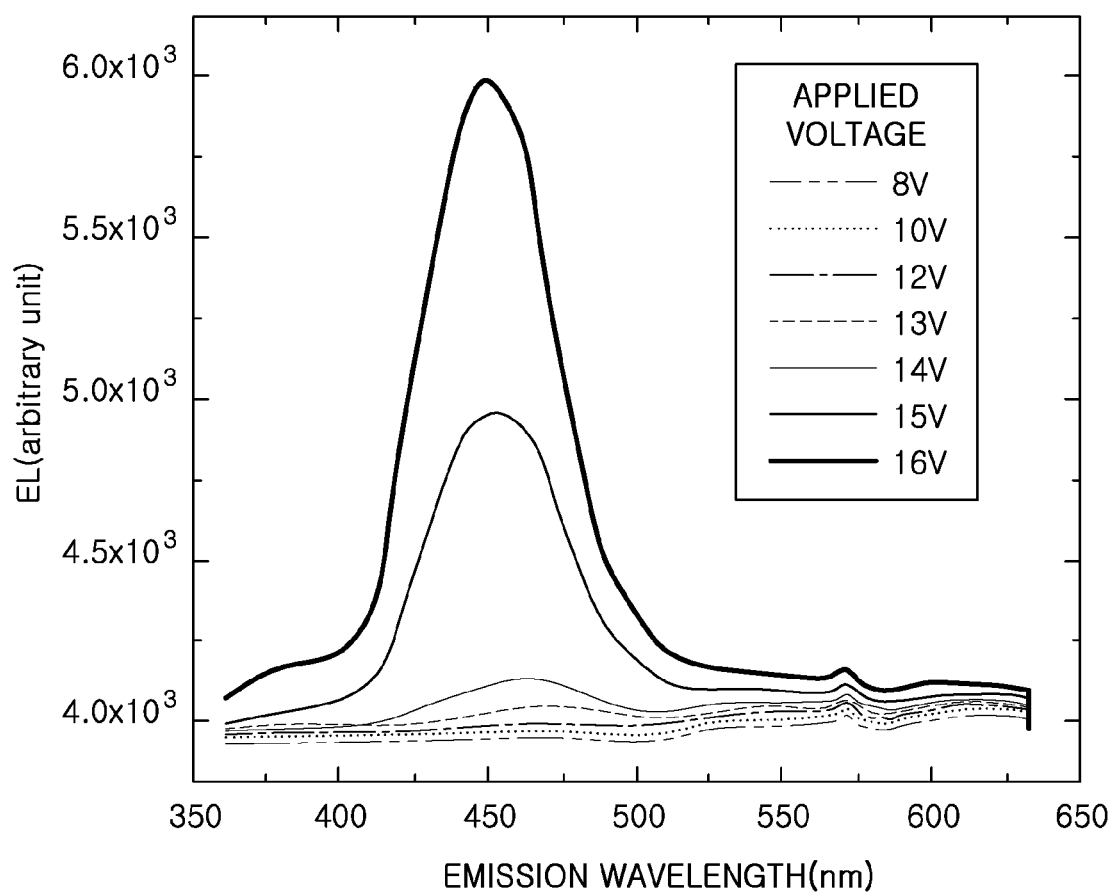
FIG. 9 is a diagram showing Electroluminescence (EL) properties of a group III nitride nanorod light emitting device according to an exemplary embodiment of the present invention.

FIG. 9 is a diagram showing Electroluminescence (EL) properties of a group III nitride nanorod light emitting device according to an exemplary embodiment of the present invention. It can be seen that light having a wavelength of approximately 450 nm is emitted from the light emitting device. Lighting intensity increases according to the increase of applied voltage.

The group III nitride nanorod light emitting device manufactured according to the exemplary embodiments of the present invention may control the composition ratio of the active layer and an emission wavelength range due to the formation of monocrystalline group III nitride nanorods having various diameters and lengths. Moreover, the crystallinity of the group III nitride nanorods may be improved, whereby the plurality of light emitting mechanisms and the light-emitting recombination efficiency of electrons and electron-holes are enhanced to thereby improve light emitting efficiency. A contact area between the active layer and the p-type semiconductor layer, that is, a current injection area may be increased by forming the p-type semiconductor layer to cover the entire surface of the active layer.

As set forth above, according to exemplary embodiments of the invention, defects in nanorod crystals could be reduced, and a contact area between the active layer and the conductive semiconductor layer may be increased, whereby the emission efficiency of the group III nitride nanorod light emitting device could be improved.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of manufacturing a group III nitride nanorod light emitting device, the method comprising steps of:
preparing a substrate;
forming an insulating film including one or more openings exposing parts of the substrate on the substrate;
growing first conductive group III nitride nanorod seed layers on parts of the substrate exposed through the openings, by supplying a group III source gas and a nitrogen (N) source gas;
growing first conductive group III nitride nanorods on the first conductive group III nitride nanorod seed layers by supplying the group III source gas, an impurity source gas and the N source gas;
forming an active layer on a surface of each of the first conductive group III nitride nanorods; and
forming a second conductive nitride semiconductor layer on the active layer, wherein:
the step of growing first conductive group III nitride nanorods includes a first growth process forming middle portions of the first conductive group III nitride nanorods on the first conductive group III nitride nanorod seed layers and a second growth process forming end portions of the first conductive group III nitride nanorods, and
the group III source gas and an impurity source gas are supplied in a pulse mode during the step of growing first conductive group III nitride nanorods, while the N source gas is continuously supplied without a pulse mode during at least the first growth process;
the impurity source gas is silane ($SiH_4$);
wherein the group III source gas is trimethyl gallium (TMGa); and
wherein the N source gas is ammonia ($NH_3$).

2. The method of claim 1, wherein in the growing of the first conductive group III nitride nanorod seed layers, the first conductive group III nitride nanorod seed layers have growth rates in the range of 70 nm/min to 120 nm/min.

3. The method of claim 1, wherein in the growing of the first conductive group III nitride nanorod seed layers, the first conductive group III nitride nanorod seed layers are grown to a height of the insulating film.

4. The method of claim 1, wherein in the second growth process, at least one of a temperature in the second growth process, a flow rate of the group III source gas, a flow rate of the N source gas, and a pulse width of the group III source gas are controlled to thereby control shapes of the end portions of the first conductive group III nitride nanorods.

5. The method of claim 1, wherein in the growing of the first conductive group III nitride nanorods, the first conductive group III nitride nanorods have growth rates in the range of 30 nm/min to 70 nm/min.

6. The method of claim 1, wherein the group III source gas and the impurity source gas are scattered in a pulse mode having a predetermined period and a predetermined pulse width.

7. The method of claim 1, wherein the substrate includes at least one selected from a group consisting of sapphire, silicon (Si), zinc oxide (ZnO), gallium arsenide (GaAs), silicon carbide (SiC), $MgAl_2O_4$, a magnesium oxide (MgO), lithium aluminate ($LiAlO_2$), $LiGaO_2$, and gallium nitride (GaN).

8. The method of claim 1, wherein the insulating film includes at least one selected from a group consisting of silicon dioxide ($SiO_2$), titanium dioxide ($TiO_2$), aluminum oxide ($Al_2O_3$), titanium nitride (TiN), aluminum nitride (AlN), zirconium dioxide ($ZrO_2$), titanium aluminium nitride (TiAlN), titanium silicon nitride (TiSiN), and silicon nitride ($Si_3N_4$).

9. The method of claim 1, wherein the active layer includes at least a pair of a quantum barrier layer and a quantum well layer.

10. The method of claim 9, wherein the quantum barrier layer is formed of $Al_yGa_{1-y}N(0 \leqq y \leqq 1)$, and the quantum well layer is formed of $In_xGa_{1-x}N(0 \leqq x \leqq 1)$.

11. The method of claim 1, further comprising:
forming an electron blocking layer between the active layer and the second conductive nitride semiconductor layer.

* * * * *